United States Patent [19]
Giordano

[11] 4,220,877
[45] Sep. 2, 1980

[54] TEMPERATURE COMPENSATED SWITCHING CIRCUIT

[75] Inventor: Raymond L. Giordano, Flemington, N.J.

[73] Assignee: RCA Corporation, New York, N.Y.

[21] Appl. No.: 904,439

[22] Filed: May 9, 1978

[51] Int. Cl.² .................... H03K 3/26; H03K 17/60
[52] U.S. Cl. .................................. 307/310; 307/254; 307/249; 307/317 A
[58] Field of Search ........... 307/254, 310, 249, 317 A, 307/251; 357/28, 34

[56] References Cited
U.S. PATENT DOCUMENTS

| | | | |
|---|---|---|---|
| 3,715,609 | 2/1973 | Hallen | 307/310 |
| 3,867,644 | 2/1975 | Cline | 307/317 A |
| 3,975,649 | 8/1976 | Kawagoe et al. | 307/310 |

Primary Examiner—Stanley D. Miller, Jr.
Assistant Examiner—B. P. Davis
Attorney, Agent, or Firm—Paul J. Rasmussen; Allen LeRoy Limberg; John M. O'Meara

[57] ABSTRACT

Temperature compensation is provided in a switching circuit for the channel resistance of a MOS/FET transistor through which a voltage source is applied to an output terminal. The gate-source voltage of the transistor is varied directly with temperature changes to hold the channel resistance substantially constant within the switching circuit. In a particular embodiment, at least one output level of a pulse amplifier is controlled through the temperature compensated switching circuit of the invention. The other output level of this pulse amplifier is applied through a bipolar transistor of a second switching circuit in another embodiment. The base current of the bipolar transistor is varied inversely with temperature to hold the saturation voltage drop thereacross substantially constant within the second switching circuit. High temperature nonsaturating means for interrupting the base current to the bipolar transistor is combined with this temperature compensation to enhance the turn-on speed of the bipolar transistor, in still another embodiment.

11 Claims, 3 Drawing Figures

TEMPERATURE COMPENSATED SWITCHING CIRCUIT

The present invention is directed to a switching circuit for controlling an output level through a MOS/FET transistor having a substantially constant channel resistance thereacross as temperature changes. Many approaches are known in the circuitry arts to the general problem of temperature compensation. In the art of integrated circuitry, however, most known approaches apply only to circuits having bipolar transistors and when temperature compensated, these circuits either demonstrate a slow switching speed or encounter voltage breakdown at high output levels.

In the switching circuit of the present invention, an output level is controlled through a MOS/FET transistor and means for varying the gate-source voltage of this transistor directly with temperature is included to hold the channel resistance thereof substantially constant as temperature changes. This switching circuit is particularly appropriate for use in a pulse amplifier to control each output level thereof. It can also be utilized to control one output level in the pulse amplifier, while a second switching circuit controls the other output level thereof through a bipolar transistor. Embodiments utilizing this second switching circuit may include means for varying the base current of the bipolar transistor inversely with temperature to hold the saturation voltage thereacross substantially constant as temperature changes. HIgh temperature nonsaturating means for interrupting the base current to the bipolar transistor may also be included in those embodiments where the second switching circuit is utilized, to enhance the turn-on speed of the bipolar transistor.

Figure 1:
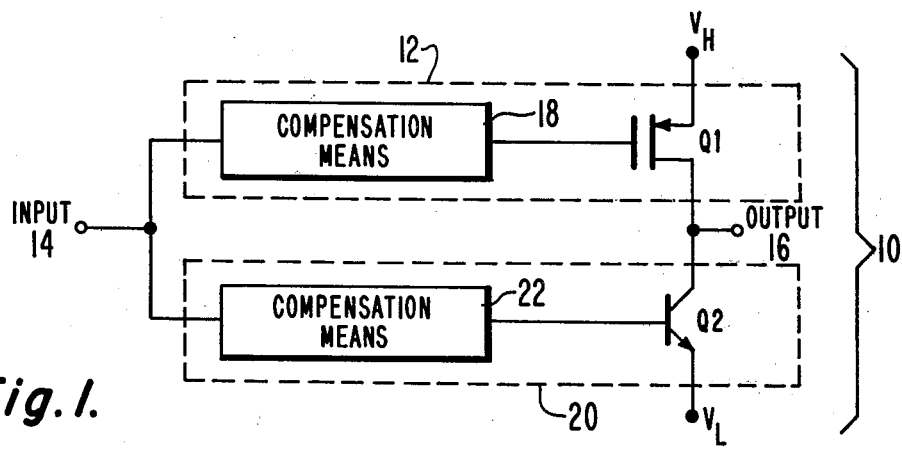
FIG. 1 is a schematic-block diagram of a pulse amplifier having the switching circuit of the invention disposed therein along with a second switching circuit to respectively control the high and low output levels thereof.

Turning now to the drawings, a pulse amplifier 10 having the switching circuit 12 of this invention incorporated threin is shown in FIG. 1. A signal applied to the input terminal 14 of amplifier 10 controls whether the output terminal 16 receives a high voltage from the source terminal $V_H$ or a low voltage from the source terminal $V_L$. The switching circuit 12 selectively connects terminal $V_H$ to terminal 16 through the drain-source conduction path of a MOS/FET transistor $Q_1$. Terminal 14 is connected to the gate of $Q_1$ through a compensation means 18 for varying the gate-source voltage of $Q_1$ to hold the drain-source channel resistance thereof substantially constant as temperature changes. A second switching circuit 20 connects terminal $V_L$ to terminal 16 through the main conduction path of a bipolar transistor $Q_2$. Input terminal 14 is connected to the base of $Q_2$ through a compensation means 22 for varying the flow of base current into $Q_2$ to hold the saturation voltage thereof substantially constant as temperature changes. It should be understood without further explanation that compensation means 18 is thermally coupled with $Q_1$ and compensation means 22 is thermally coupled with $Q_2$ so that continuously related temperatures exist therebetween.

A load would be connected at terminal 16 and affects the voltage level thereat when either switching circuit 12 or 20 is rendered conductive by the control signal at terminal 14. However, compensation means 18 operates to hold the channel resistance of $Q_1$ substantially constant as temperature changes, while compensation means 22 operates to hold the saturation voltage across $Q_2$ substantially constant as temperature changes. Therefore, the current and voltage available for the load at terminal 16 will be substantially constant whether switching circuit 12 or 20 is rendered conductive by the control signal, if it is assumed that the effect of the load is properly temperature compensated. As is conventional in pulse amplifiers, the control signal at the input terminal 14 renders only switching circuit 12 or switching circuit 20 conductive at any given time.

The switching circuit 12 of this invention is useful in applications other than the pulse amplifier 10 where low drift outputs are important as temperature change. In applications where the load on the switching circuit 12 is not temperature compensated, the channel resistance of the MOS/FET transistor can be controlled to provide such temperature compensation. Futhermore, switching circuit 12 with a MOS/FET transistor of complementary conductivity type to that of $Q_1$ could replace switching circuit 20 in amplifier 10 of FIG. 1.

Figure 2:
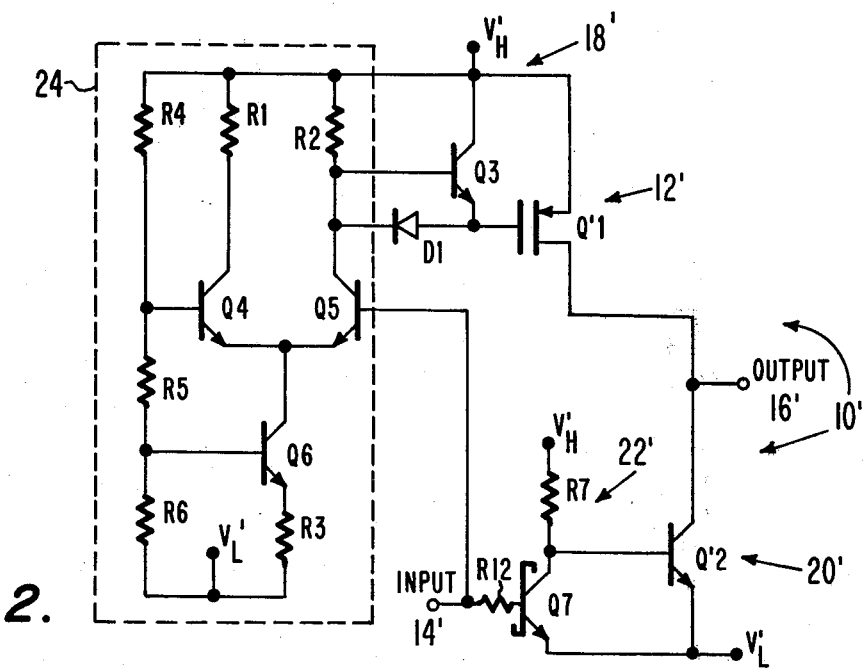
FIG. 2 is a schematic diagram for one circuit embodiment of the pulse amplifier shown in FIG. 1.

A specific circuit embodiment for the amplifier 10 of FIG. 1 is illustrated in FIG. 2. In the switching circuit 12' of this embodiment, the gate of the MOS/FET transistor $Q'_1$ is separately connected to the signal output from a nonsaturating voltage comparator 24 through a diode $D_1$ and to the source terminal $V'_H$ through the main conduction path of a bipolar transistor $Q_3$. $D_1$ is poled for conduction therethrough to increase the gate-source voltage of $Q'_1$ in accordance with enhanced drain-source channel conductivity thereof. The base of $Q_3$ is connected to the signal output from comparator 24 which renders $Q_3$ conductive to charge a gate/source capacitance whenever $D_1$ is reversed-biased thereby. Bipolar transistors $Q_4$ and $Q_5$ are differentially connected in comparator 24 with one side of their main conduction path commonly connected to one side of the main conduction path through a bipolar transistor $Q_6$. The other sides of the main conduction paths through $Q_4$ and $Q_5$ are connected to terminal $V'_H$ through resistors $R_1$ and $R_2$, respectively. The other side of the main conduction path through $Q_6$ is connected to terminal $V'_L$ through a resistor $R_3$. Resistors $R_4$, $R_5$ and $R_6$ are successively connected in series between terminals $V'_H$ and $V'_L$ with the base of $Q_4$ being connected at the interconnection between $R_4$ and $R_5$, while the base of $Q_6$ is connected at the interconnection between $R_5$ and $R_6$. The control signal on terminal 14' of amplifier 10' is connected to the signal input of comparator 24 at the base of $Q_5$.

When the control signal on terminal 14' exceeds the level that is applied at the base of $Q_4$, $Q_5$ becomes conductive to reduce the signal output level from comparator 24 relative to terminal $V'_H$. This lower signal level causes current to flow through $D_1$, which establishes a gate-source voltage differential within $Q'_1$ of a polarity to render the drain-source channel thereof conductive. If the gate-source voltage of $Q'_1$ were fixed, the channel resistance thereof would tend to vary directly with temperature, so that the voltage drop thereacross and the current flow therethrough would not be held constant for a given load. Therefore, $Q_6$ is disposed in comparator 24 to regulate current flow through $Q_5$ and thereby vary the gate-source voltage of $Q'_1$ to hold the drain-source channel resistance thereof substantially constant as temperature changes. Because $Q_6$ is connected in a common-base configuration, its collector current will be substantially equal to its emitter-current. Furthermore, both the collector current and emitter current of $Q_6$ will demonstrate a positive temperature coefficient due to the negative temperature coefficient that is exhibited by the base-emitter junction resistance of $Q_6$ and the constant voltage that is applied to the base of $Q_6$ by the voltage divider network of $R_4$, $R_5$ and $R_6$ as temperature changes. Of course, $R_3$ will affect the value of emitter current drawn by $Q_6$ while both $R_2$ and $R_3$ will affect the gate-source voltage of $Q_1$ that is derived from collector current flowing through $Q_6$. Consequently, by selecting $R_2$ and $R_3$ with compatible positive temperature-coefficients to the negative temperature-coefficient for the base-emitter junction resistance of $Q_6$, the gate-source voltage of $Q_1$ will demonstrate the positive temperature-coefficient that is necessary to hold the drain-source channel resistance of $Q_1$ substantially constant as temperature changes. Furthermore, saturated conduction through $Q_5$ in comparator 24 can be precluded to enhance the speed at which $Q_1$ is rendered nonconductive. This is accomplished by selecting the values of $R_4$, $R_5$ and $R_6$ so that the base of $Q_6$ is biased to limit current flow through the main conduction path of $Q_5$ to a level below that required thereby for saturation.

A Schottky transistor $Q_7$ and a resistor $R_7$ are disposed within the compensation means 22' of the switching circuit 20' in FIG. 2. Within $Q_7$, a Schottky barrier diode (not shown separately) is connected between the collector and the base of a bipolar transistor to provide a parallel conduction path across the collector-base junction thereof. When the transistor is conductive, its collector-base junction is clamped at the forward-bias voltage of the diode and therefore, the switching delay caused by saturation of the transistor is minimized. $R_7$ is connected between terminal $V'_H$ and one side of main conduction path through $Q_7$, while terminal $V'_L$ is connected to the other side of the main conduction path through $Q_7$. Terminal 14' is at the base of $Q_7$ and is the signal input for switching circuit 20' at which the control signal is applied. $Q'_2$ is connected with its base to the interconnection between $R_7$ and the main conduction path of $Q_7$, and with its main conduction path between terminals 16' and $V'_L$. The signal output from switching circuit 20' is taken at terminal 16'. Resistor $R_{12}$ limits the base current of $Q_7$.

When a low level control signal is applied at terminal 14', $Q_7$ is rendered nonconductive to in turn render $Q'_2$ conductive, and switching means 20' operates to apply a voltage at terminal 16'. Because the saturation voltage of $Q'_2$ tends to vary directly with temperature, $R_7$ is selected to have a positive temperature coefficient so that the base current of $Q'_2$ will vary inversely with temperature. Therefore, by scaling the resistance value and the temperature coefficient of $R_7$ in accordance with the saturation voltage temperature coefficient of $Q'_2$, the saturation voltage drop across $Q'_2$ is held substantially constant as temperature changes.

Figure 3:
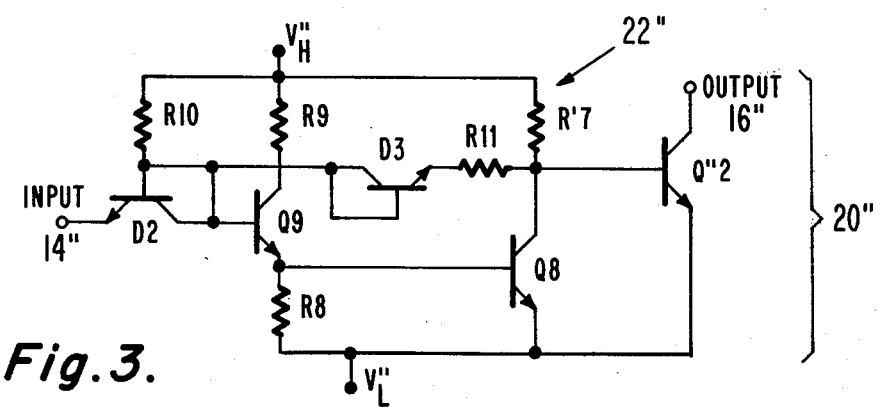
FIG. 3 is a schematic diagram for another embodiment of the second switching circuit in the pulse amplifier of FIG. 1.

Although the nonsaturation characteristics of the Schottky transistor $Q_7$ in the compensation means 22' of FIG. 2 are quite satisfactory for many applications, in high temperature environments such characteristics deteriorate. Use of the Schottky transistor can be avoided in another embodiment of switching circuits 20'' which is illustrated in FIG. 3. In the compensation means 22'', $R'_7$ is connected between terminal $V''_H$, and $V''_L$ through the main conduction path of a bipolar transistor $Q_8$. The base of $Q_8$ is connected to terminal $V''_L$ through a resistor $R_8$ and to terminal $V''_H$ through the main conduction path of another bipolar transistor $Q_9$ in series with a resistor $R_9$. The base of $Q_9$ is commonly connected to one electrode of separate diodes $D_2$ and $D_3$ which are each derived from one junction of a bipolar transistor having its other junction shunted. This common connection is also connected to terminal $V''_H$ through a resistor $R_{10}$. Terminal 14'' is at the other electrode of $D_2$ and is the signal input for switching circuit 20'' at which the control signal is applied. The other electrode of $D_3$ is connected through a resistor $R_{11}$ to the interconnection between $R'_7$ and the main conduction path of $Q_8$, while $Q''_2$ is connected with its base to that same interconnection and with its main conduction path between terminals 16'' and $V''_L$. The signal output from switching circuit 20'' is taken at terminal 16''.

When a high level control signal is applied at terminal 14'' of sufficient magnitude to reverse bias $D_2$, the base-emitter junction of $Q_9$ becomes forward-biased and $Q_9$ draws base current from $V''_H$ through $R_{10}$ to rapidly become conductive. The resistance values of $R_8$ and $R_9$ are selected to establish a voltage drop across $R_8$ of sufficient magnitude to forward-bias the base-emitter junction of $Q_8$ which also becomes conductive rapidly. The main conduction path of $Q_8$ then draws current from $V''_H$ through $R'_7$ to drop the voltage on the base of $Q''_2$ which becomes nonconductive when its base-emitter junction becomes reverse-biased. When the voltage on the base of $Q''_2$ drops sufficiently to forward-bias the junction of $D_3$ relative to the voltage on the base of $Q_9$, base current is diverted from $Q_9$ through $R_{11}$. The voltage level on the base of $Q_9$ is above $V''_L$ by a magnitude equal to $V_{BEQ8} + V_{BEQ9}$ so that $D_3$ remains nonconductive until the voltage on the base of $Q''_2$ drops below this voltage level by at least the barrier voltage of its junction.

With $Q_8$, $Q_9$ and $D_3$ all conductive, the collector current of $Q_8$ is drawn from $V''_H$ through $R'_7$ and through $R_{11}$, $D_3$ and $R_{10}$. Consequently, $Q_8$ is provided with a collector-to-base feedback connection through $R_{11}$, $D_3$ and the emitter-follower action of $Q_9$ to relate both the base current of $Q_9$ and the collector current of $Q_8$ to the voltage drop across $R_{10}$. This voltage drop stabilizes at a value equal to $V''_H - (V_{BEQ9} + V_{BEQ8})$. Since $Q_8$ must rapidly become nonconductive if $Q''_2$ is to become rapidly conductive, $R_{11}$ is sized to hold the voltage on the base of $Q''_2$ below its $V_{BE}$ level, while holding the collector-emitter voltage across $Q_8$ to less than its saturation level. Assuming that the current through $R_{11}$ is substantially equal to the current through $R_{10}$ and the junction barrier voltage of $D_3$ and the $V_{BE}$ of $Q_8$ and $Q_9$ are substantially identical, such as would be the case in an integrated circuit, this is accomplished in the circuitry of FIG. 3 by making the value of $R_{11} = R_{10}(V_{BE}/2)/(V''_H - 2V_{BE})$.

When a low level control signal is applied at terminal 14'' to forward-bias $D_2$, both the base-emitter junction of $Q_9$ and the junction of $D_3$ become reverse-biased. $Q_9$ is rendered nonconductive to in turn render $Q_8$ nonconductive, while $D_3$ is rendered nonconductive to discontinue current flow through $R_{11}$. Because $Q_8$ had previously been in nonsaturated conduction, it turns off rapidly to forward bias the base-emitter junction of $Q''_2$ which turns on rapidly to draw base current from $V''_H$ through $R'_7$. Because the saturation voltage of $Q''_2$ tends to vary directly with temperature, $R'_7$ is selected to have a positive temperature coefficient so that the base current of $Q''_2$ will vary inversely with temperature. Therefore, by selecting the value and temperature coefficient for $R'_7$ in accordance with the saturation voltage temperature coefficient of $Q''_2$, the saturation voltage drop across $Q''_2$ is held substantially constant as temperature changes.

Those skilled in the art should understand without further explanation that the high voltage source terminal rather than the low voltage source terminal could have been connected to the output terminal through the switching circuit 20, 20', and 20" of FIGS. 1, 2 and 3 respectively. Furthermore, the transistors in these switching circuits could also be of the PNP conductivity type, even though only NPN conductivity type are shown.

Therefore, this invention has been disclosed herein by describing only selected emobodiments thereof and it should be understood by those skilled in the art that numerous changes in the details of construction and the combination or arrangement of parts could be made in the described embodiments without departure from the true scope or spirit of the invention. Consequently, the present disclosure should be construed as illustrative rather than limited.

What I claim is:

1. A switching circuit of the type wherein a voltage source is applied through a MOS/FET transistor to the output terminal thereof, a signal at the input terminal thereof controls the conductivity of said MOS/FET transistor, and compensation means is provided for varying the gate-source voltage of said MOS/FET transistor to hold the drain-source channel resistance thereof substantially constant as temperature changes, which compensation means comprises:
   a bipolar transistor having base, emitter and collector electrodes, and having a base-emitter junction;
   means for conditioning said bipolar transistor for supplying a current from its collector electrode that increases with temperature owing to the negative temperature coefficient of the base-emitter junction of said bipolar transistor, including
   a resistor with a first end to which the emitter electrode of said bipolar transistor connects and with a second end, and includiing
   means for applying a voltage between the base electrode of said bipolar transistor and the second end of said resistor;
   means responsive to a positive temperature coefficient current for applying a voltage between the source and gate electrodes of said MOS/FET transistor and exhibiting a temperature coefficient to hold the drain-source channel resistance thereof substantially constant; and
   means for applying at least at selected times the collector electrode current of said bipolar transistor as said positive temperature coefficient current.

2. The switching circuit of claim 1 wherein said means for applying at least at selected times includes a further bipolar transistor having its collector electrode connected to said means responsive to a positive temperature coefficient current, having its emitter electrode connected to the collector electrode of said bipolar transistor, and having a base electrode.

3. The switching circuit of claim 2 wherein said signal at the input terminal thereof is coupled to the base electrode of said further bipolar transistor for conditioning said further bipolar transistor for conduction at said selected times.

4. A switching circuit of the type wherein a voltage source is applied through a MOS/FET transistor to the output terminal thereof, a signal at the input terminal thereof controls the conductivity of said MOS/FET transistor, and improved compensation means is provided to vary the gate-source voltage of said MOS/FET transistor to hold the drain-source channel resistance thereof substantially constant as temperature changes, said compensation means comprising:
   a comparator, a diode and a second transistor;
   said comparator having a signal input connection and a signal output connection for supplying comparator output signal, with the input terminal of the switching circuit being said comparator signal input connection;
   the gate of the MOS/FET transistor being separately connected to said comparator signal output connection and to the voltage source respectively through said diode and the conduction path of said second transistor, with said diode being poled to increase the gate-source voltage of the MOS/FET transistor in accordance with enhanced channel conductivity thereof and with the control electrode of said second transistor being connected to said comparator signal output connection; and
   wherein said comparator includes a first bipolar transistor disposed to have the negative temperature coefficient demonstrated by the emitter-base junction resistance thereof result in the collector current thereof having a positive temperature coefficient to vary said comparator signal output in accordance with substantially constant channel resistance through the MOS/FET transistor as temperature changes.

5. The switching circuit of claim 4 wherein said comparator further includes second and third bipolar transistors and first, second, third, fourth, fifth and sixth resistors; said first, second and third resistors being successively connected in series between the source voltage and a reference voltage; the base of said second bipolar transistor being connected at the interconnection between said first and second resistors; the base of said first bipolar transistor being connected at the interconnection between said second and said third resistors; one side of the main conduction paths through said second and third bipolar transistors being commonly connected to said reference voltage through the main conduction path of said first bipolar transistor in series with said fourth resistor; the other side of the conduction paths through said second and third bipolar transistors being connected to the voltage source through said fifth and sixth resistors, respectively; said signal input being the base of said third bipolar transistor and said signal output being the interconnection between the conduction path of said third bipolar transistor and said sixth resistor; and wherein the values of said first, second and third resistors are selected for biasing the base of said first bipolar transistor in accordance with the limitation of current flow through the main conduction path of said third bipolar transistor to below saturation levels.

6. The switching circuit of claim 5 wherein the source voltage is positive and the MOS/FET transistor is a p-channel type, while said second transistor and all of said bipolar transistors are NPN types.

7. In a pulse amplifier of the type wherein high and low voltage sources are separately applied through first and second switching circuits to the output terminal thereof and a signal at the input terminal thereof controls both switching circuits, the improvement wherein at least the first switching circuit applies its voltage source through a MOS/FET transistor and includes compensation means for varying the gate-source voltage of said MOS/FET transistor to hold the drain-source channel resistance thereof substantially constant as temperature changes; and wherein the second switching circuit applies its voltage source through a first bipolar transistor and includes compensation means for varying the flow of base current into said bipolar transistor to hold the saturation voltage thereof substantially constant as temperature changes.

8. The pulse amplifier of claim 7 wherein said bipolar transistor compensation means includes a Schottky transistor having its base connected to receive the control signal and having its main conductive path connected between the high and low voltage sources through a resistor, the base of said first bipolar transistor being connected to the interconnection between said resistor and the main conductive path of said Schottky transistor, said resistor and the saturation voltage of said first bipolar transistor both having positive temperature coefficients so that the base current of said first bipolar transistor varies inversely with temperature to result in a substantially constant saturation voltage thereacross as temperature changes.

9. The pulse amplifier of claim 7 wherein said bipolar transistor compensation means includes second and third bipolar transistors, first and second diodes, and first, second, third, fourth and fifth resistors; the main conduction path of said second transistor having one side thereof connected to the voltage source of the first switching circuit through said first resistor, and having the other side thereof connected both to the base of said third transistor and to the voltage source of the second switching circuit through said second resistor; the main conduction path of said third transistor having one side thereof connected to the voltage source of the second switching circuit and the other side thereof connected separately to one terminal of said first diode through said third resistor and to the voltage source of the first switching circuit through said fourth resistor; the other electrode of said first diode being commonly connected to one electrode of said second diode, to the base of said second transistor, and to the voltage source of the first switching circuit through said fifth resistor; said first and second diodes each being poled to conduct current away from the base of said second transistor; the input terminal of the second switching circuit being the other electrode of said second diode and the base of said first bipolar transistor being connected at the interconnection of said third and fourth resistors with the main conduction path of said third transistor; said fourth resistor and the saturation voltage of said first transistor both having positive temperature coefficients so that the base current of said first bipolar transistor varies inversely with temperature to result in a substantially constant saturation voltage thereacross as temperature changes; said third and fifth resistors being selected to hold the quiescent collector-emitter voltage of said third transistor at a level to preclude the saturated operation thereof.

10. The pulse amplifier of claim 9 wherein a P-N junction in fourth and fifth bipolar transistors are respectively connected as said first and second diodes.

11. The pulse amplifier of claim 10 wherein the voltage source of the second switching circuit is low and all of said bipolar transistors are NPN types having substantially the same base-emitter voltage characteristic; said P-N junctions in said fourth and fifth transistors being the base-emitter junctions thereof while the collector-base junctions thereof are shunted, the collector-emitter voltage of said third transistor being fixed at one-half the common base-emitter voltage characteristic of said bipolar transistors.

* * * * *

UNITED STATES PATENT AND TRADEMARK OFFICE
CERTIFICATE OF CORRECTION

PATENT NO. : 4,220,877
DATED : Sept. 2, 1980
INVENTOR(S) : Raymond Louis Giordano It is certified that error appears in the above—identified patent and that said Letters Patent is hereby corrected as shown below:

Column 1, line 31, change "HIgh" to --High--

Column 1, line 49, change "threin" to --therein--

Column 2, line 21, change "temperature change" to --temperature changes--

Column 6, line 22, after "being" insert --at--

Signed and Sealed this

Tenth Day of February 1981

[SEAL]

Attest:

Attesting Officer

RENE D. TEGTMEYER

Acting Commissioner of Patents and Trademarks

UNITED STATES PATENT AND TRADEMARK OFFICE
CERTIFICATE OF CORRECTION

PATENT NO. : 4,220,877

DATED : September 2, 1980

INVENTOR(S) : Raymond Louis Giordano

It is certified that error appears in the above—identified patent and that said Letters Patent is hereby corrected as shown below:

Cover page, left-hand column. After the line beginning with "[22] Filed", insert:

-- [30] Foreign Application Priority Data

May 16, 1977 Great Britain...20554/77

April 18, 1978 Great Britain...20554/78 --.

Signed and Sealed this

Thirtieth Day of June 1981

[SEAL]

Attest:

RENE D. TEGTMEYER

Attesting Officer

Acting Commissioner of Patents and Trademarks